United States Patent
Hashimoto et al.

(10) Patent No.: US 11,083,083 B2
(45) Date of Patent: Aug. 3, 2021

(54) INDUCTOR BRIDGE AND ELECTRONIC DEVICE

(71) Applicant: Murata Manufacturing Co., Ltd., Nagaokakyo (JP)

(72) Inventors: Takuya Hashimoto, Nagaokakyo (JP); Masayoshi Yamamoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/897,317

(22) Filed: Jun. 10, 2020

(65) Prior Publication Data

US 2020/0305277 A1    Sep. 24, 2020

Related U.S. Application Data

(63) Continuation of application No. PCT/JP2018/047445, filed on Dec. 25, 2018.

(30) Foreign Application Priority Data

Dec. 26, 2017   (JP) .............................. JP2017-250243

(51) Int. Cl.
*H05K 1/02* (2006.01)
*H01F 17/00* (2006.01)
(Continued)

(52) U.S. Cl.
CPC ....... *H05K 1/0278* (2013.01); *H01F 17/0013* (2013.01); *H01Q 1/38* (2013.01);
(Continued)

(58) Field of Classification Search
CPC .... H05K 1/0278; H05K 1/0393; H05K 1/165; H05K 1/189; H05K 1/147; H05K 1/028;
(Continued)

(56) References Cited

U.S. PATENT DOCUMENTS

2012/0181068 A1   7/2012   Kato et al.
2015/0294781 A1  10/2015   Yosui et al.
(Continued)

FOREIGN PATENT DOCUMENTS

WO   2011/040393 A1   4/2011
WO   2014/129279 A1   8/2014
(Continued)

OTHER PUBLICATIONS

Official Communication issued in International Patent Application No. PCT/JP2018/047445, dated Mar. 5, 2019.

*Primary Examiner* — Sherman Ng
(74) *Attorney, Agent, or Firm* — Keating & Bennett, LLP

(57) ABSTRACT

An inductor bridge includes a flexible substrate and a coil defined by a conductor pattern provided on or in the flexible substrate, and connects a plurality of circuit portions. The flexible substrate includes a rigid portion and a flexible portion, the rigid portion being wider than the flexible portion. The rigid portion includes the coil and a joining portion connected to another circuit. The coil includes two coil portions located at different positions in plan view, a flexible portion is located adjacent to one side of the rigid portion, and at least two coil portions of the plurality of coil portions are located on the one side when viewed from the joining portion.

14 Claims, 8 Drawing Sheets

(51) Int. Cl.
*H01Q 1/38* (2006.01)
*H05K 1/03* (2006.01)
*H05K 1/16* (2006.01)
*H05K 1/18* (2006.01)

(52) U.S. Cl.
CPC .......... *H05K 1/0393* (2013.01); *H05K 1/165* (2013.01); *H05K 1/189* (2013.01); *H01F 2017/006* (2013.01); *H05K 2201/0141* (2013.01); *H05K 2201/0158* (2013.01); *H05K 2201/10015* (2013.01)

(58) Field of Classification Search
CPC .......... H01F 17/0013; H01F 2017/006; H01F 2017/0046; H01F 17/0006; H01Q 1/38
USPC ......................................................... 174/254
See application file for complete search history.

(56) References Cited

U.S. PATENT DOCUMENTS

| | | | |
|---|---|---|---|
| 2015/0340151 A1* | 11/2015 | Yosui | H05K 1/0281 336/200 |
| 2015/0371761 A1* | 12/2015 | Yosui | H03H 7/0115 343/850 |
| 2016/0014893 A1* | 1/2016 | Yosui | H05K 1/028 174/254 |
| 2016/0055948 A1* | 2/2016 | Yosui | H01F 27/292 336/232 |
| 2016/0372819 A1* | 12/2016 | Okamoto | H01Q 1/243 |
| 2019/0116659 A1 | 4/2019 | Morita et al. | |

FOREIGN PATENT DOCUMENTS

| | | |
|---|---|---|
| WO | 2014/171266 A1 | 10/2014 |
| WO | 2015/015975 A1 | 2/2015 |
| WO | 2017/221955 A1 | 12/2017 |

\* cited by examiner

INDUCTOR BRIDGE AND ELECTRONIC DEVICE

CROSS REFERENCE TO RELATED APPLICATIONS

This application claims the benefit of priority to Japanese Patent Application No. 2017-250243 filed on Dec. 26, 2017 and is a Continuation Application of PCT Application No. PCT/JP2018/047445 filed on Dec. 25, 2018. The entire contents of each application are hereby incorporated herein by reference.

BACKGROUND OF THE INVENTION

1. Field of the Invention

The present invention relates to an element that connects two circuit portions, and more particularly, to an inductor bridge including an inductance component and an electronic device including the inductor bridge.

2. Description of the Related Art

Conventionally, when a small electronic device such as a mobile terminal includes a circuit portion provided on a circuit board or the like and a circuit portion such as an antenna provided by a member different from the circuit board, the circuit portions are sometimes connected via a flexible inductor bridge as indicated, for example, in WO 2014/129279.

When the flexible inductor bridge is mounted on a circuit board or the like, due to a structure in which the inductor bridge is arranged in a limited space, the inductor bridge not only merely has a bending portion, but also tends to be subject to a stress due to bending.

The circuit portion is joined to a joining portion of the inductor bridge. The stress due to bending is likely to be applied to this joining portion. Therefore, there is a possibility that poor connection between the joining portion and the circuit portion can be induced.

Further, when the coil is deformed under the influence of the bending, the inductance of the coil can deviate from a specified value.

SUMMARY OF THE INVENTION

Preferred embodiments of the present invention provide inductor bridges that each have increased connection reliability between a joining portion and a circuit portion with respect to bending, and electronic devices each including an inductor bridge. Further, preferred embodiments of the present invention provide inductor bridges that each significantly reduce or prevent a deviation of inductance of a coil with respect to bending, and electronic devices each including such inductor bridges.

An inductor bridge according to a preferred embodiment of the present invention includes a flexible substrate and a coil defined by a conductor pattern provided on or in the flexible substrate, the inductor bridge connecting a plurality of circuit portions. The flexible substrate includes at least one rigid portion and at least one flexible portion, the at least one rigid portion being wider than the flexible portion, and the at least one rigid portion includes the coil and a joining portion connected to another circuit. The coil includes a plurality of coil portions located at different positions in plan view, and the flexible portion is located adjacent to one side of the at least one rigid portion. At least two of the plurality of coil portions are located on the one side when viewed from the joining portion, and the plurality of coil portions located on the one side when viewed from the joining portion includes a first coil portion and a second coil portion. The second coil portion is located nearer to the one side than the first coil portion, and an inductance of the second coil portion is substantially equal to or less than an inductance of the first coil portion.

Since the wide rigid portion where the joining portion is provided has a long length from the joining portion to the flexible portion, a stress due to bending of the flexible portion is hardly transmitted to the joining portion. Further, due to the presence of the coil in the rigid portion, the rigidity of the rigid portion is further increased, and poor connection at the joining portion is significantly reduced or prevented. Further, since the deformation of the entire coil is also significantly reduced or prevented, the deviation of the inductance of the coil is also significantly reduced or prevented.

Further, since the second coil portion is nearer to the flexible portion, the amount of deformation due to a bending stress is larger as compared with that of the first coil portion. However, the deviation of inductance due to deformation of the second coil portion is relatively small, and the deviation of the inductance of the entire coil is significantly reduced or prevented.

The flexible substrate may be a multilayer substrate including a plurality of laminated insulating base material layers, and a conductor pattern defining the coil may be provided over the plurality of insulating base material layers.

The uniformity of the layer thickness of the insulating base material layers is so high that stable characteristics are provided as compared, for example, with a structure in which a coil is defined by a single-layer conductor pattern.

The flexible portion may include a bending portion. With this structure, the inductor bridge is able to be easily bent into a predetermined shape as compared with a structure in which the rigid portion is bent. Further, since the flexible portion is bent, not the rigid portion, the connection reliability of the joining portion is able to be maintained, and the fluctuation of the inductance of the coil is able to be reduced or prevented.

An electronic device according to a preferred embodiment of the present invention comprises an inductor bridge, a first circuit portion, and a second circuit portion, the first circuit portion and the second circuit portion being connected via the inductor bridge. The inductor bridge includes a flexible substrate and a coil defined by a conductor pattern provided on or in the flexible substrate, the inductor bridge connecting a plurality of circuit portions. The flexible substrate includes at least one rigid portion and at least one flexible portion, the at least one rigid portion is wider than the flexible portion, and the at least one rigid portion includes the coil and a joining portion connected to another circuit. The coil includes a plurality of coil portions located at different positions in plan view, and the flexible portion is located adjacent to one side of the at least one rigid portion. At least two of the plurality of coil portions are located on the one side when viewed from the joining portion, and the plurality of coil portions located on the one side when viewed from the joining portion includes a first coil portion and a second coil portion. The second coil portion is located nearer to the one side than the first coil portion, and an inductance of the second coil portion is substantially equal to or less than an inductance of the first coil portion. In a state where the flexible portion is bent, the first circuit portion and the second circuit portion are connected via the inductor bridge.

With the above configuration, an electronic device including an inductor bridge with high connection reliability at the joining portion is able to be provided. Further, an electronic device including an inductor bridge in which the deviation of the inductance of the coil is significantly reduced or prevented is able to be provided.

According to preferred embodiments the present invention, inductor bridges that each have increased connection reliability between the joining portion and the circuit portion with respect to bending, and electronic devices including such inductor bridges are provided. Further, the inductor bridges in each of which the deviation of the inductance of the coil with respect to bending is significantly reduced or prevented, and the electronic devices each including such inductor bridges are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
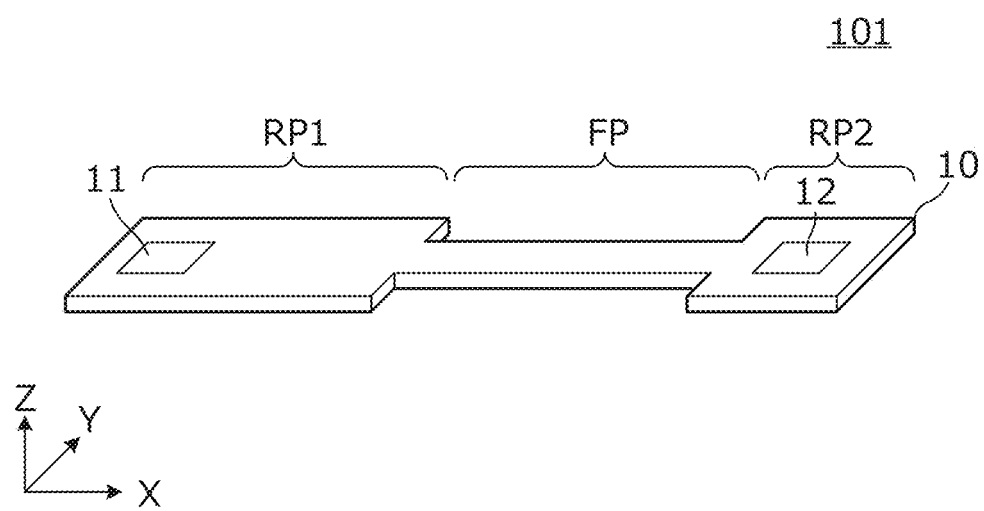
FIG. 1 is an external perspective view of an inductor bridge 101 according to a first preferred embodiment of the present invention.

Hereinafter, preferred embodiments of the present invention will be described with reference to the drawings by way of some specific examples. In the drawings, the same or similar elements and portions are denoted by the same reference numerals. Although preferred embodiments are separately indicated for the sake of convenience in consideration of description of points or the ease of understanding, partial replacement or combination of features in different preferred embodiments is possible. In the second and subsequent preferred embodiments, description of matters common to the first preferred embodiment will be omitted, and only different points will be described. In particular, the same or similar advantageous operations and effects of the same features will not be sequentially described for each preferred embodiment.

First Preferred Embodiment

FIG. 1 is an external perspective view of an inductor bridge 101 according to a first preferred embodiment of the present invention. The inductor bridge 101 includes a flexible substrate 10 and a coil defined by a conductor pattern provided on or in the flexible substrate 10, and connects a plurality of circuit portions.

The flexible substrate 10 includes wide rigid portions RP1 and RP2 and a narrow flexible portion FP. That is, the rigid portions RP1 and RP2 are wider than the flexible portion FP. In FIG. 1, the direction along the Y axis is the width direction. A first joining portion 11 is provided on the rigid portion RP1 of the inductor bridge 101, and a second joining portion 12 is provided on the rigid portion RP2.

Figure 2:
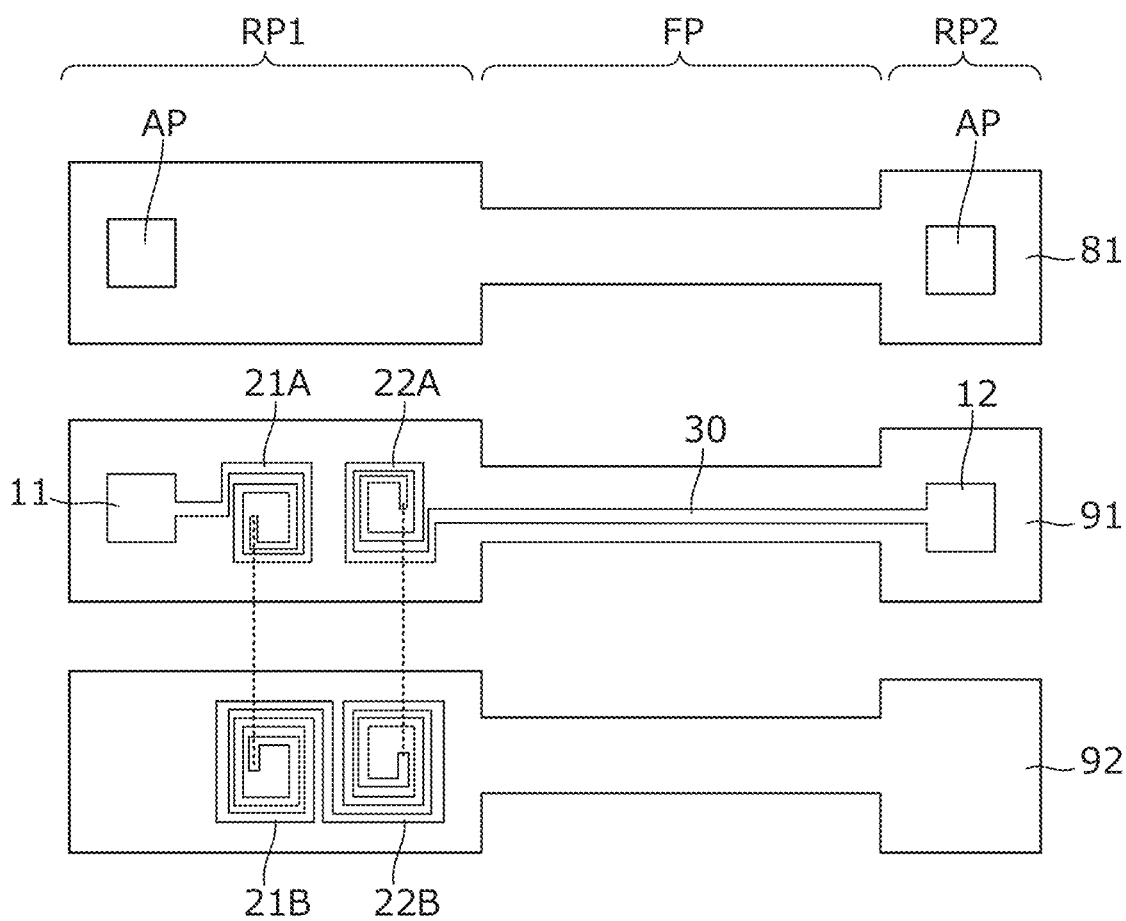
FIG. 2 is a plan view of each layer of the inductor bridge 101.

FIG. 2 is a plan view of each layer of the inductor bridge 101. The inductor bridge 101 includes insulating base material layers 91 and 92 and a resist film 81. On the insulating base material layer 91, a first joining portion 11, a first coil portion 21A, and a second coil portion 22A are provided. A second joining portion 12 is provided on the rigid portion RP2. In the flexible portion FP, a wiring portion 30 that electrically connects the second coil portion 22A and the second joining portion 12 is provided. A first coil portion 21B and a second coil portion 22B are provided on the insulating base material layer 92.

The inner peripheral end of the first coil portion 21A and the inner peripheral end of the first coil portion 21B are electrically connected via an interlayer connection conductor. Similarly, the inner peripheral end of the second coil portion 22A and the inner peripheral end of the second coil portion 22B are electrically connected via an interlayer connection conductor.

Openings AP that expose the first joining portion 11 and the second joining portion 12 are provided through the resist film 81.

The insulating base material layers 91 and 92 are preferably flexible insulating base material layers, for example, liquid crystal polymer (LCP) and polyetheretherketone (PEEK). The resist film 81 is preferably a printable insulating resin material, for example. Each conductor pattern is preferably provided by patterning, for example, a Cu foil.

Thus, a coil as an inductor is provided by the two coil portions located at different positions in plan view. The first coil portions 21A and 21B and the second coil portions 22A and 22B are magnetically coupled via a closed-loop magnetic flux that interlinks them. This magnetic field coupling couples the first coil portions 21A and 21B, and the second coil portions 22A and 22B by additive polarity. Therefore, the inductance of the entire coil is the sum of the self-inductance of the first coil portions 21A and 21B, the self-inductance of the second coil portions 22A and 22B, and the mutual inductance by the magnetic field coupling.

As shown in FIG. 2, the flexible portion FP is located adjacent to one side (the direction along the X axis) of the rigid portion RP1. The first coil portions 21A and 21B and the second coil portions 22A and 22B are located on the one side (the direction along the X axis) when viewed from the first joining portion 11.

According to the first preferred embodiment, since the wide rigid portion RP1 where the first joining portion 11 is provided has a long length from the first joining portion 11 to the flexible portion FP, the stress due to the bending of the flexible portion FP is hardly transmitted to the first joining portion 11. Further, the rigidity of the rigid portion RP1 is high due to the presence of the coil of the rigid portion RP1. In particular, since the first coil portions 21A and 21B and the second coil portions 22A and 22B have a spiral shape and high-density conductor patterns are provided substantially uniformly, the rigidity of the entire rigid portion RP1 is high. Therefore, poor connection at the first joining portion 11 is significantly reduced or prevented. Further, since the deformation of the entire coil is also significantly reduced or prevented, the deviation of the inductance of the coil is significantly reduced or prevented.

Second Preferred Embodiment

In a second preferred embodiment of the present invention, an example of an inductor bridge including a coil different from that of the first preferred embodiment will be described.

Figure 3:
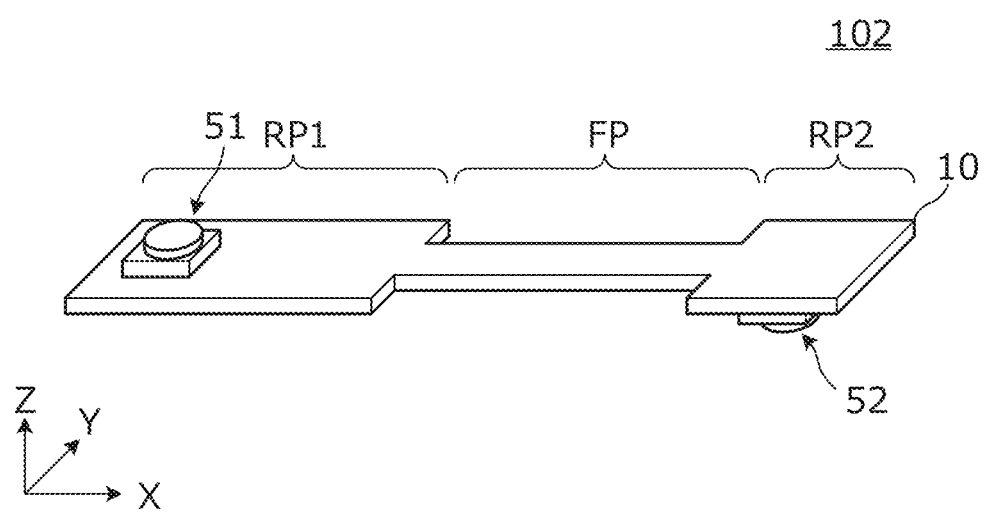
FIG. 3 is an external perspective view of an inductor bridge 102 according to a second preferred embodiment of the present invention.

FIG. 3 is an external perspective view of the inductor bridge 102 according to the second preferred embodiment. The inductor bridge 102 includes a flexible substrate 10 and a coil defined by a conductor pattern provided on or in the flexible substrate 10, and connects two circuit portions. The inductor bridge 102 includes connectors 51 and 52. The connector 51 is joined to a first joining portion, which will be described later. The connector 52 is joined to a second joining portion, which will be described later.

Figure 4:
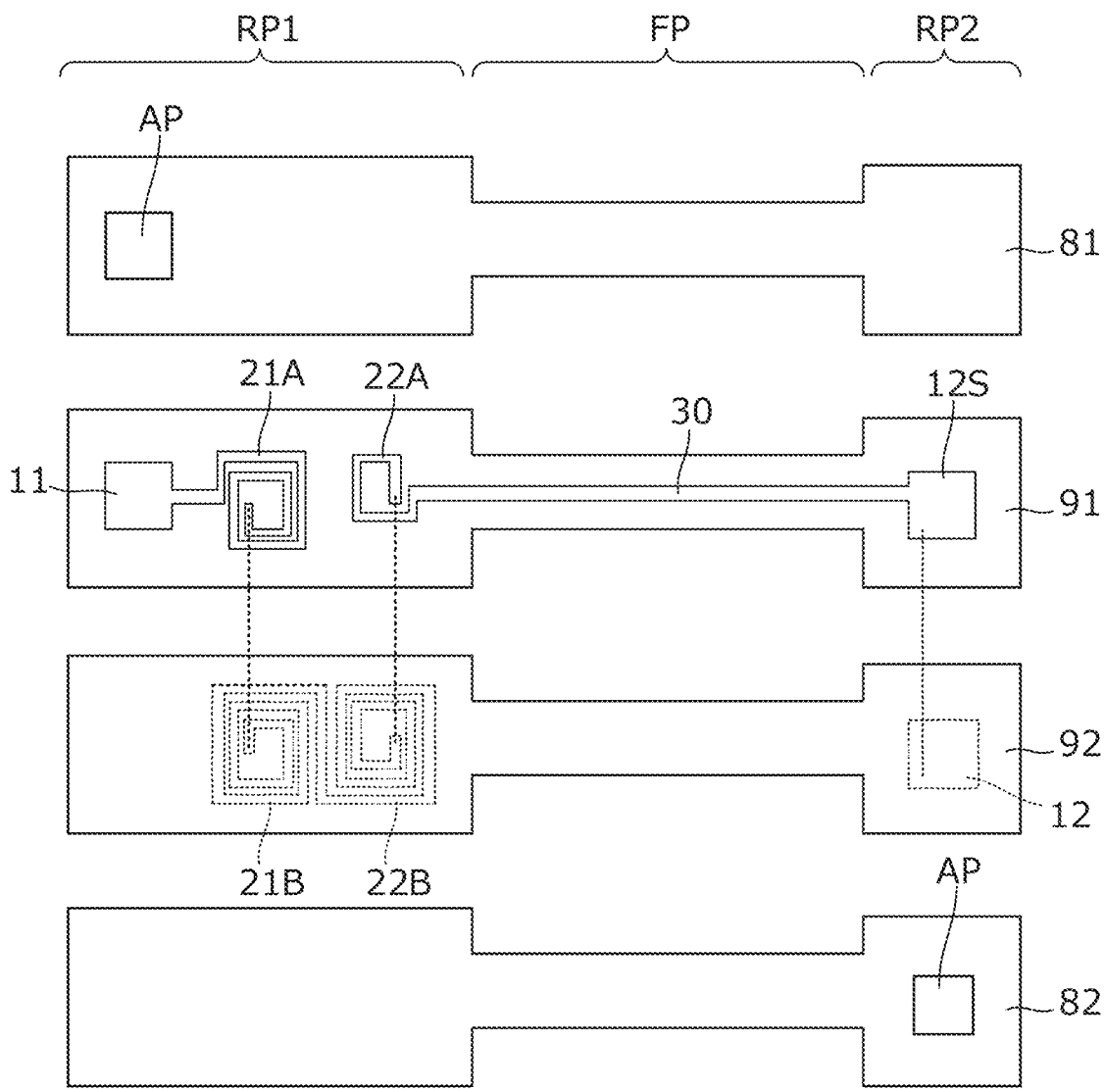
FIG. 4 is a plan view of each layer of the inductor bridge 102.

FIG. 4 is a plan view of each layer of the inductor bridge 102. The inductor bridge 102 includes insulating base material layers 91 and 92 and resist films 81 and 82. A first joining portion 11, a first coil portion 21A, and a second coil portion 22A are provided in the rigid portion RP1 of the insulating base material layer 91. An internal electrode 12S of the second joining portion is provided in the rigid portion RP2. In the flexible portion FP, a wiring portion 30 that electrically connects the second coil portion 22A and the internal electrode 12S of the second joining portion is provided. A second joining portion 12, a first coil portion 21B, and a second coil portion 22B are provided on the insulating base material layer 92.

The inner peripheral end of the first coil portion 21A and the inner peripheral end of the first coil portion 21B are electrically connected via an interlayer connection conductor. Similarly, the inner peripheral end of the second coil portion 22A and the inner peripheral end of the second coil portion 22B are electrically connected via an interlayer connection conductor. Further, the internal electrode 12S of the second joining portion and the second joining portion 12 are electrically connected via an interlayer connection conductor.

An opening AP that exposes the first joining portion 11 is provided through the resist film 81. Further, an opening AP that exposes the second joining portion 12 is provided through the resist film 82.

A connector 51 is joined to the first joining portion 11, and a connector 52 is joined to the second joining portion 12.

In the second preferred embodiment, the numbers of coil turns of the second coil portions 22A and 22B are smaller than the numbers of coil turns of the first coil portions 21A and 21B. In other words, the inductance of the second coil portions 22A and 22B is smaller than the inductance of the first coil portions 21A and 21B.

Figure 5:
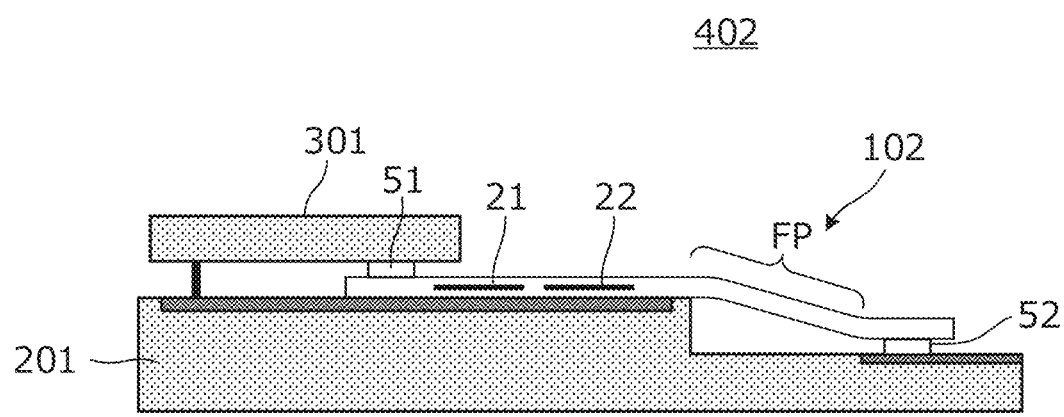
FIG. 5 is a cross-sectional view of a main portion of an electronic device 402 according to the second preferred embodiment of the present invention.

FIG. 5 is a cross-sectional view of a main portion of the electronic device 402 according to the second preferred embodiment. The electronic device 402 includes an antenna board 301, a circuit board 201, and the inductor bridge 102.

An antenna element pattern is provided on the antenna board 301. A first connector 51 of the inductor bridge 102 is connected to a predetermined portion of the antenna element pattern. A second connector 52 of the inductor bridge 102 is connected to a connection provided on the upper surface of the circuit board 201. In FIG. 5, the first coil portions 21A and 21B are collectively represented as a first coil portion 21. Similarly, the second coil portions 22A and 22B are collectively represented as a second coil portion 22.

As shown in FIG. 5, the inductor bridge 102 is bent at its flexible portion FP.

As described above, since the wide rigid portion RP1 where the first joining portion 11 (connector 51) is provided has a long length from the first joining portion 11 to the flexible portion FP, the stress due to the bending of the flexible portion FP is hardly transmitted to the first joining portion 11. Further, due to the presence of the two coil portions (21A and 21B) and (22A and 22B) of the rigid portion RP1, the rigidity of the rigid portion RP1 is high, and poor connection at the first joining portion 11 is significantly reduced or prevented. Further, since the first coil portions 21A and 21B having a relatively larger number of turns are farther from the flexible portion FP than the second coil portions 22A and 22B having a smaller number of turns, the deformation of the first coil portions 21A and 21B is small. Therefore, the deviation of the inductance of the coil is significantly reduced or prevented.

Figure 6A:
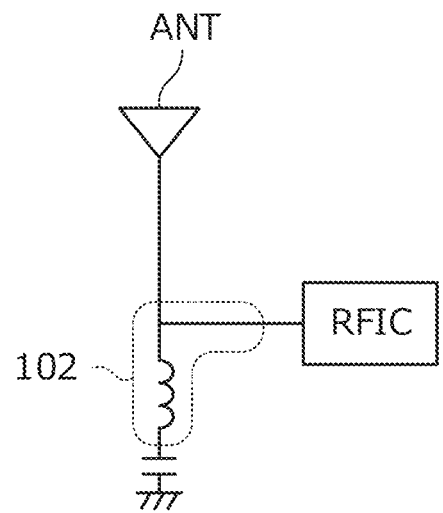
FIG. 6A is a circuit diagram of a portion including the inductor bridge 102 in the electronic device 402.
Figure 6B:
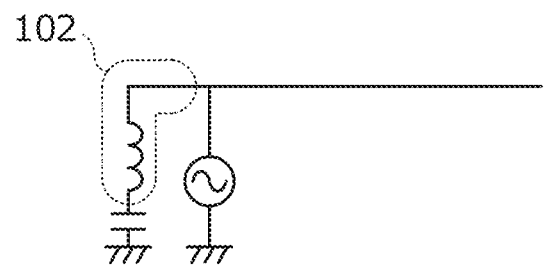
FIG. 6B is an equivalent circuit diagram thereof.

FIG. 6A is a circuit diagram of a portion including the inductor bridge 102 in the electronic device 402. FIG. 6B is an equivalent circuit diagram thereof. In FIG. 6A, an antenna ANT is defined by an antenna element pattern provided on the antenna board 301. This is an example of providing an antenna in which a series circuit of an inductor and a capacitor is inserted between a ground connection point and a ground in an inverted-F antenna. This capacitor is preferably, for example, a chip capacitor mounted on the inductor bridge 102.

Third Preferred Embodiment

In a third preferred embodiment of the present invention, an example of an inductor bridge including a coil that is different from that of the first and second preferred embodiments will be described.

Figure 7:
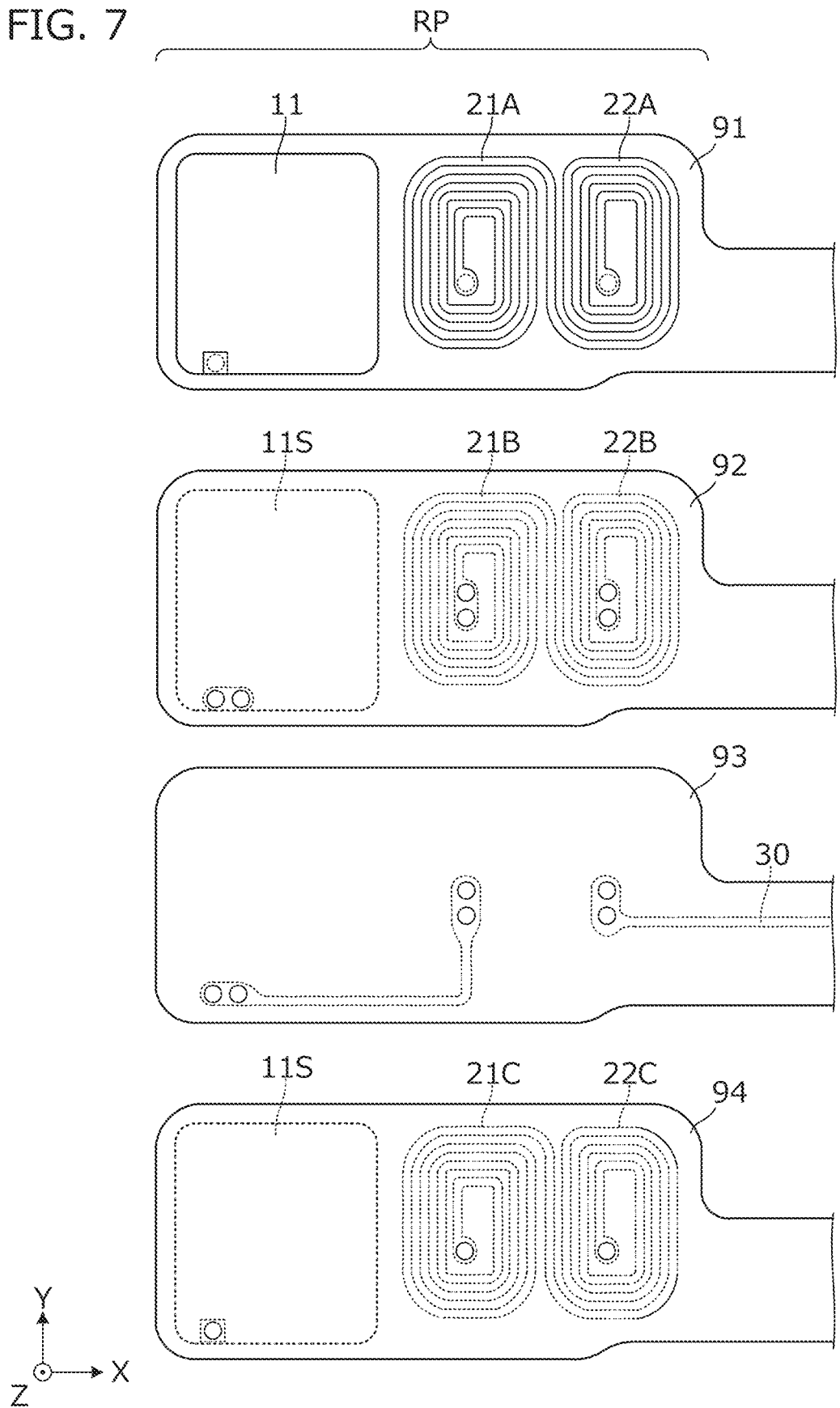
FIG. 7 is a plan view of each layer of an inductor bridge according to a third preferred embodiment of the present invention.
Figure 8:
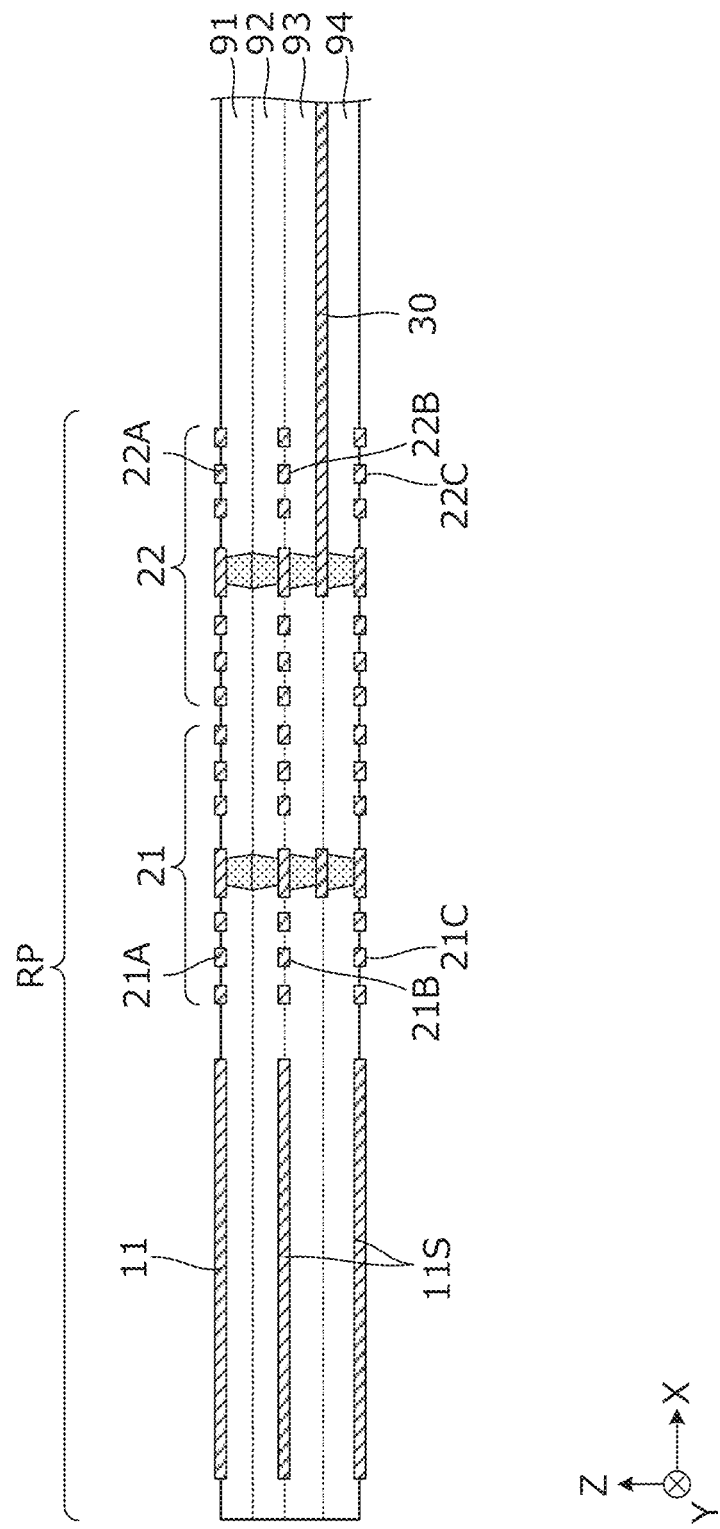
FIG. 8 is a longitudinal cross-sectional view of the inductor bridge 103.

FIG. 7 is a plan view of each layer of an inductor bridge according to the third preferred embodiment. Further, FIG. 8 is a longitudinal cross-sectional view of the inductor bridge 103. The inductor bridge 103 includes insulating base material layers 91, 92, 93 and 94. A first joining portion 11, a first coil portion 21A, and a second coil portion 22A are provided in a rigid portion RP of the insulating base material layer 91. An internal electrode 11S of a first joining portion, a first coil portion 21B, and a second coil portion 22B are provided in a rigid portion RP of the insulating base material layer 92. An internal electrode 11S of a first joining portion, a first coil portion 21C, and a second coil portion 22C are provided in a rigid portion RP of the insulating base material layer 94.

In the rigid portion RP of the insulating base material layer 93, a wiring conductor that electrically connects the first joining portion 11 and the internal electrode 11S of the first joining portion to the inner peripheral ends of the first coil portions 21A, 21B, and 21C is provided.

The flexible portion FP includes a wiring portion 30 extracting from the inner peripheral ends of the second coil portions 22A, 22B, and 22C.

The coil of the inductor bridge 103 of the third preferred embodiment includes a series circuit of the first coil portion 21A and the second coil portion 22A, a series circuit of the first coil portion 21B and the second coil portion 22B, and a series circuit of the first coil portion 21C and the second coil portion 22C, which are electrically connected in parallel.

As described above, the flexible substrate is a multilayer substrate including a plurality of laminated insulating base material layers, and the conductor pattern providing the coil is provided over the plurality of insulating base material layers.

With the above configuration, the uniformity of the layer thickness of the insulating base material is so high that stable characteristics are provided as compared, for example, with a structure in which a coil is defined by a single-layer conductor pattern. Further, even if the thickness of the conductor pattern of each layer is thin, a direct current resistance component of the coil is able to be significantly reduced by electrically connecting the plurality of coil portions in parallel.

Further, according to the third preferred embodiment, since the internal electrode 11S of the first joining portion is laminated on the first joining portion 11, the rigidity of the first joining portion is able to be further increased.

Note that, as shown in FIG. 8, the layer from which the wiring portion 30 is extracted is located between two coil conductor pattern formation layers (a formation layer of the coil portions 21B and 22B and a formation layer of the coil portions 21C and 22C). Thus, the layer interval between the two coil conductor patterns and the layer interval between the two coil conductor patterns and the wiring portion 30 is able to be secured. Furthermore, by not providing the wiring portion 30 between the insulating base material layers 91 and 92 where the interlayer connection conductors are continuously provided, the two coil conductor patterns (coil portions 21A and 22A and coil portions 21B and 22B) connected by the interlayer connection conductors are able to be prevented from contacting the wiring portion 30.

Note that a resist film may be provided on the outer surfaces of the insulating base material layers 91 and 94.

Other Preferred Embodiments

The descriptions of the preferred embodiments of the present invention are provided as examples, and do not limit the scope of the present invention. Modifications and changes may be made by those skilled in the art as appropriate. The scope of the present invention is defined by the claims, not by the aforementioned preferred embodiments. Further, the scope of the present invention includes changes from the preferred embodiments within the scope equivalent to the scope of the claims.

For example, the coil portion provided in the rigid portion is not limited to being defined by two coil portions, but may include two or more coil portions, and two of the coil portions may be located on one side (X-axis direction side) when viewed from the first joining portion 11.

Further, the number of laminated insulating base material layers may be different between the rigid portion and the flexible portion. In particular, increasing the number of laminations of the rigid portion is effective in increasing the rigidity.

Further, the bending direction of the flexible portion is not limited to the direction in which the surface of the flexible substrate is bent, but may include a component that provides bending in a direction along the surface. Further, there may be a torsion component.

Further, the coil may be defined by a single-layer conductor pattern. Further, the coil is not limited to a spiral shape, and the coil portion of each layer may have a substantially one-turn coil pattern.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An inductor bridge comprising:
a flexible substrate; and
a coil defined by a conductor pattern provided on or in the flexible substrate; wherein
the inductor bridge connects a plurality of circuit portions;
the flexible substrate includes at least one rigid portion and at least one flexible portion;
the at least one rigid portion is wider than the flexible portion;
the at least one rigid portion includes the coil and a joining portion connected to another circuit;
the coil includes a plurality of coil portions located at different positions in plan view;
the flexible portion is located adjacent to one side of the at least one rigid portion;
at least two of the plurality of coil portions are located on the one side when viewed from the joining portion;
the plurality of coil portions located on the one side when viewed from the joining portion include a first coil portion and a second coil portion;
the second coil portion is located nearer to the one side than the first coil portion; and
an inductance of the second coil portion is substantially equal to or less than an inductance of the first coil portion.

2. The inductor bridge according to claim 1, wherein
the flexible substrate is a multilayer substrate including a plurality of laminated insulating base material layers; and
a conductor pattern defining the coil is provided over the plurality of insulating base material layers.

3. The inductor bridge according to claim 1, further comprising a bending portion in the flexible portion.

4. An electronic device comprising:
an inductor bridge;
a first circuit portion; and
a second circuit portion; wherein
the first circuit portion and the second circuit portion are connected via the inductor bridge;
the inductor bridge includes a flexible substrate and a coil defined by a conductor pattern provided on or in the flexible substrate, the inductor bridge connecting a plurality of circuit portions;
the flexible substrate includes at least one rigid portion and at least one flexible portion;
the at least one rigid portion is wider than the flexible portion;
the at least one rigid portion includes the coil and a joining portion connected to another circuit;
the coil includes a plurality of coil portions located at different positions in plan view;
the flexible portion is located adjacent to one side of the at least one rigid portion;
at least two of the plurality of coil portions are located on the one side when viewed from the joining portion;
the plurality of coil portions located on the one side when viewed from the joining portion include a first coil portion and a second coil portion;
the second coil portion is located nearer to the one side than the first coil portion;

an inductance of the second coil portion is substantially equal to or less than an inductance of the first coil portion; and in a state where the flexible portion is bent, the first circuit portion and the second circuit portion are connected via the inductor bridge.

5. The electronic device according to claim 4, wherein the flexible substrate is a multilayer substrate including a plurality of laminated insulating base material layers; and a conductor pattern defining the coil is provided over the plurality of insulating base material layers.

6. The electronic device according to claim 4, further comprising a bending portion in the flexible portion.

7. The inductor bridge according to claim 2, wherein the multilayer substrate includes a resist film provided on the plurality of laminated insulating base material layers.

8. The inductor bridge according to claim 7, wherein the resist film includes at least one opening that exposes the joining portion.

9. The inductor bridge according to claim 2, wherein the plurality of laminated insulating base material layers include at least one of liquid crystal polymer (LCP) and polyetheretherketone (PEEK).

10. The inductor bridge according to claim 1, wherein the at least one rigid portion includes a first rigid portion and a second rigid portion;

the first rigid portion is located adjacent to a first side of the flexible portion; and the second rigid portion is located adjacent to a second side of the flexible portion.

11. The inductor bridge according to claim 10, wherein the first rigid portion includes the coil and the joining portion; and the second rigid portion includes a second joining portion.

12. The inductor bridge according to claim 1, wherein the first coil portion and the second coil portion are magnetically coupled by a closed-loop magnetic flux.

13. The electronic device according to claim 4, wherein the first circuit portion includes an antenna element pattern.

14. The electronic device according to claim 4, wherein a capacitor is mounted on the inductor bridge.

* * * * *